United States Patent [19]
Conley

[11] Patent Number: 5,712,578
[45] Date of Patent: Jan. 27, 1998

[54] PLA ARCHITECTURE HAVING IMPROVED CLOCK SIGNAL TO OUTPUT TIMING USING A TYPE-I DOMINO AND PLANE

[75] Inventor: Bryon G. Conley, Hillsboro, Oreg.

[73] Assignee: Intel Corporation, Santa Clara, Calif.

[21] Appl. No.: 579,095

[22] Filed: Dec. 27, 1995

[51] Int. Cl.⁶ .................................... H03K 19/177
[52] U.S. Cl. ...................... 326/39; 326/41; 326/93
[58] Field of Search ........................ 326/39–41, 44, 326/93, 95, 98

[56] References Cited

U.S. PATENT DOCUMENTS

| | | | |
|---|---|---|---|
| 4,899,066 | 2/1990 | Aikawa et al. | 326/98 |
| 4,950,928 | 8/1990 | Schnizlein | 326/98 X |
| 4,962,327 | 10/1990 | Iwazaki | 326/41 |
| 5,010,258 | 4/1991 | Usami et al. | 326/98 X |
| 5,258,666 | 11/1993 | Furuki | 326/95 X |

OTHER PUBLICATIONS

Popescu, Val, Merle Schultz, John Sprackle, Gary Gibson, Bruce Lightner and David Isaman, "The Metaflow Architecture", IEEE Micro, Jun. 1991, pp. 10–13 and 63–73.

Primary Examiner—David R. Hudspeth
Attorney, Agent, or Firm—Blakely, Sokoloff, Taylor & Zafman

[57] ABSTRACT

A programmable logic array architecture having improved clock signal to output timing includes a logical AND plane and a logical OR plane. The logical AND plane generates a plurality of intermediary outputs responsive to the plurality of inputs. The logical OR plane then generates a plurality of outputs responsive to the plurality of intermediary outputs. The logical AND plane includes a plurality of semiconductors interconnected in a Type I dynamic logic configuration, and the logical OR plane includes a second plurality of semiconductors interconnected in a Type II dynamic logic configuration.

20 Claims, 6 Drawing Sheets

the foregoing.

PLA ARCHITECTURE HAVING IMPROVED CLOCK SIGNAL TO OUTPUT TIMING USING A TYPE-I DOMINO AND PLANE

BACKGROUND OF THE INVENTION

1. Field of the Invention

The present invention pertains to the field of digital circuitry. More particularly, this invention relates to programmable logic array circuitry.

2. Background

As the computer revolution has progressed the quest of microprocessor and other electronic devices developers has been to develop chips exhibiting more power and faster performance. Substantial effort has been focused on increasing transistor populations on single integrated circuits. That effort continues with today's microprocessors now housing literally millions of transistors on a single chip. Further integration has allowed processor clock speeds to be greatly increased with the increased density of transistors.

Given their increased power and performance, modern microprocessors have found uses in a wide range of fields. Many of the electronic goods which are commercially available today and the majority of control systems used in manufacturing and industry include one or more microprocessors.

One electronic component which is used in a wide variety of electronic devices, including microprocessors, is a programmable logic array (PLA). A PLA is a logic device which can be programmed to provide certain predefined outputs based on its inputs. A PLA can typically be programmed for any combination of outputs based on its inputs, but can generally be programmed only once.

PLAs are useful in a wide variety of environments. They provide a relatively inexpensive way to generate customized combinatorial logic for a wide variety of applications. Additionally, PLAs also provide an efficient mechanism for decoding many combinatorial terms from a large number of inputs. One disadvantage to PLAs, however, is the speed at which they operate. PLAs are typically synchronous devices having a large number of gates. This large number of gates increases the amount of time required by the PLA to generate an output signal after assertion of the input signals and the clock signal. Typical PLAs that are currently available are designed to reduce power consumption without much concern for the amount of time necessary to generate the outputs after assertion of the clock signal. Thus, it would be beneficial to provide an improved PLA which reduces the period of time between assertion of the clock signal and valid outputs from the PLA.

A PLA typically comprises a logical AND plane and a logical OR plane. FIG. 1 shows an example of a typical PLA. PLA 100 includes multiple Type II dynamic logical AND devices 101 and multiple Type II dynamic logical OR devices 102. Multiple input signals 103 are input to logical AND devices 104 prior to being input to PLA 100. The logical AND devices 104 logically AND together the input signals 103 and a clock signal 105. Logical AND devices 104 ensure that the input signals 103 are not input too early to the multiple logical AND devices 101.

The logical AND devices 104 ensure proper operation of PLA 100, however, they introduce additional delays from the assertion of clock signal 105 until valid output signals 106. Thus, it would beneficial to provide an improved PLA which reduces the time between assertion of the clock signal and a valid output.

Additionally, substantial effort has been expended in reducing the chip area which is occupied by electronic components. Reducing the chip area required by an electronic component increases the number of electronic devices which can be included in a single integrated circuit chip. Thus, it would be beneficial to provide a PLA that has an improved clock signal to enabled output time but which does not significantly increase the chip area occupied by the PLA.

As will be described in more detail below, the present invention provides for an improved programmable logic array that achieves these and other desired results which will be apparent to those skilled in the art from the description to follow.

SUMMARY OF THE INVENTION

A programmable logic array architecture having improved clock signal to output timing using a Type-I Domino AND plane is described herein. The PLA includes a logical AND plane and a logical OR plane. The logical AND plane generates a plurality of intermediary outputs responsive to the plurality of inputs. The logical OR plane then generates a plurality of outputs responsive to the plurality of intermediary outputs. The logical AND plane includes a plurality of semiconductors interconnected in a Type I dynamic logic configuration, and the logical OR plane includes a second plurality of semiconductors interconnected in a Type II dynamic logic configuration.

In one embodiment of the present invention, the intermediary output signals which are generated by the logical AND plane (and input to the logical OR plane) are pre-charged to a first state prior to assertion of a clock signal. Then, when the clock signal is asserted, the logical AND plane quickly discharges the appropriate intermediary output lines, thereby quickly generating the intermediary output. By reducing the intermediary output signal times for the logical AND plane, the overall speed of the PLA is reduced.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
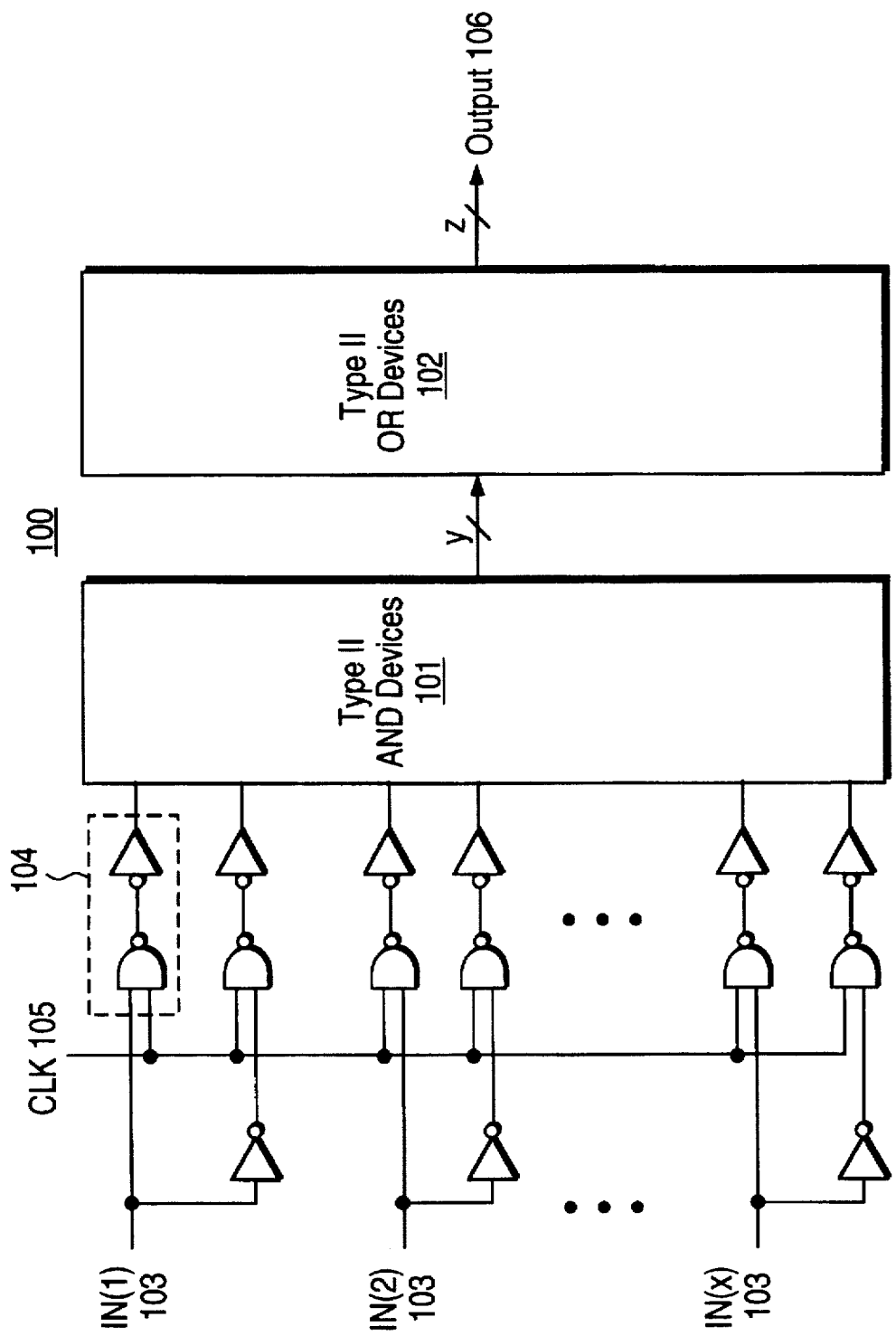
FIG. 1 shows an example of a typical prior art PLA.

In the following detailed description numerous specific details are set forth in order to provide a thorough understanding of the present invention. However, it will be understood by those skilled in the art that the present invention may be practiced without these specific details. In other instances, well known methods, procedures, components, and circuits have not been described in detail so as not to obscure aspects of the present invention. It should be noted that the present invention can be practiced in a variety of manners, such as by fabrication by silicon or gallium arsenide or other processes.

In the descriptions which follow reference is made to logical zeroes and logical ones. A logical zero typically represents a voltage of between 0.0 and 0.5 volts. When a particular signal or node is a logical zero, the signal or node is referred to as being low or in a low state. A logical one typically represents a voltage of between 1.8 and 5.5 volts. When a particular signal or node is a logical one, the signal or node is referred to as being high or in a high state. It is to be appreciated, however, that the voltages which represent a logical zero or a logical one can be different than the ranges mentioned above.

Metal-oxide semiconductor (MOS) transistors are also discussed in the descriptions which follow. A transistor is an electronic component which typically comprises two terminals (commonly referred to as source and drain) and a gate terminal. Two general types of transistors are typically used: p-channel transistors and n-channel transistors. In an n-channel transistor, current flows between the two terminals when greater than a threshold voltage is applied to the gate terminal (that is, the transistor is turned on). Generally, the greater the voltage, the greater the current flow between the terminals. If the voltage applied to the gate terminal is less than the threshold voltage, then current does not flow between the two terminals (that is, the transistor is turned off). Similarly, in a p-channel transistor, current does not flow between the two terminals when greater than a threshold voltage is applied to the gate terminal (that is, the transistor is turned off). Otherwise, current does flow between the two terminals (that is, the transistor is turned on). Generally, lower voltages provide greater current flow between the terminals.

MOS transistors are typically field effect transistors (FETs) which are either p-channel or n-channel devices. PMOS technology refers to transistors having only p-channel devices. NMOS technology refers to transistors having only n-channel devices. CMOS technology refers to transistors which use both p-channel and n-channel devices. Transistors are well-known to those skilled in the art and thus will not be described further.

The present invention provides an improved programmable logic array (PLA) circuit architecture. The PLA architecture of the present invention provides an improved clock signal to valid output signal time. The PLA includes both a logical AND plane and a logical OR plane. In one embodiment, the logical AND plane is configured as Type I domino logic and the logical OR plane is configured as Type II domino logic. The output signals which are generated by the logical AND plane (and input to the logical OR plane), are pre-charged to a first state prior to assertion of the clock signal. Then, when the clock signal is asserted, the logical AND plane quickly discharges the appropriate output lines, thereby quickly generating its intermediary output. Reducing the output signal times for the logical AND plane results in an increased overall speed of the PLA.

Figure 2:
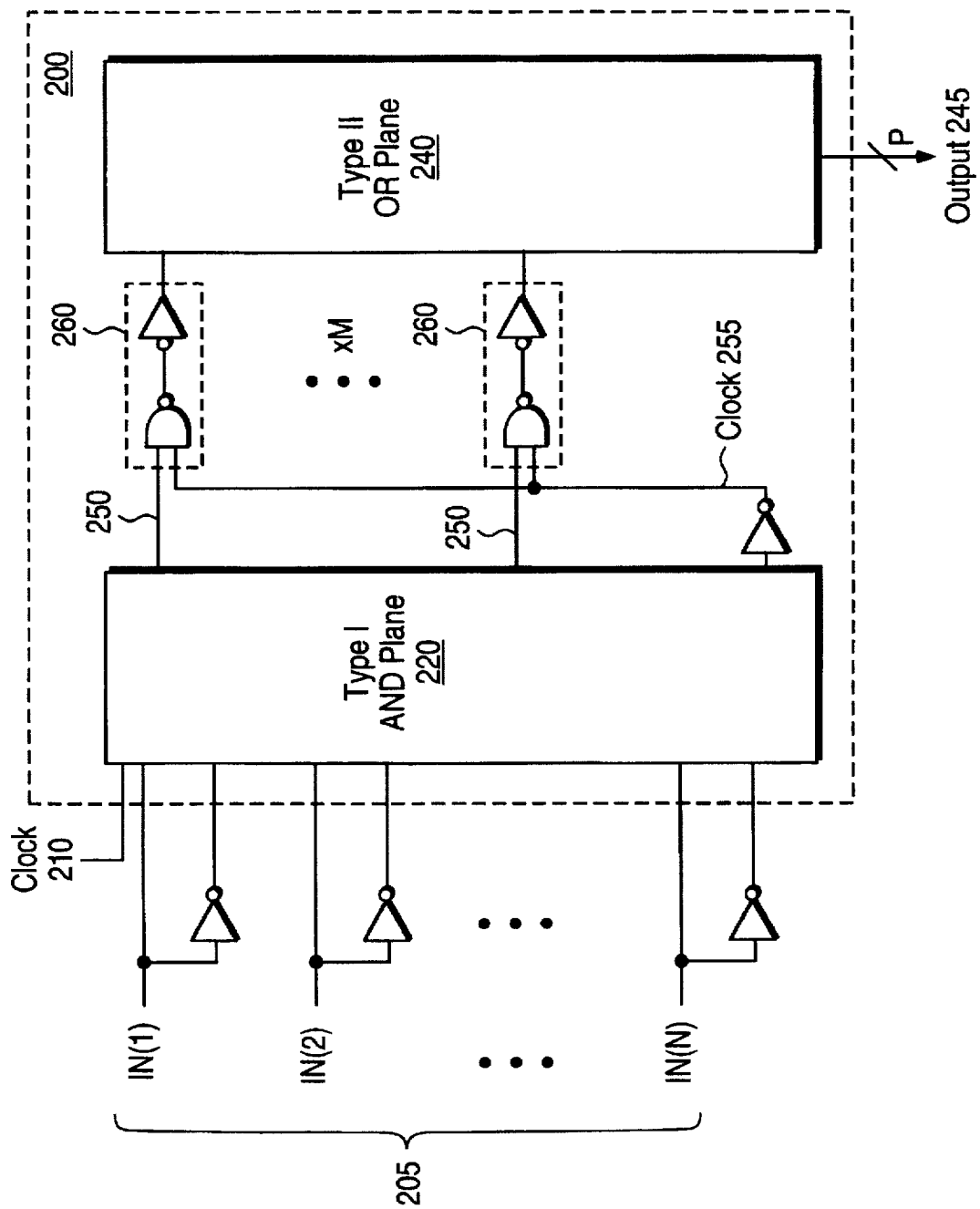
FIG. 2 shows a PLA according to one embodiment of the present invention.

A PLA according to one embodiment of the present invention is shown in FIG. 2. PLA 200 includes a logical AND plane 220, a logical OR plane 240, multiple input signal lines 205, a clock signal line 210, and output signal lines 245. In one embodiment of the present invention, the clock signal on line 210 is a 150 Mhz signal. It is to be appreciated, however, that the present invention can utilize clock signals having a wide range of frequencies.

The input signal lines 205 include n different input signals and an inversion of the input signals as shown. It is to be appreciated that any number of input signal lines can be input to PLA 200 and any number of output signal lines can be output by PLA 200. Typical PLAs have a number of input signals ranging from 1 to 50 and a number of output signals ranging from 1 to 60.

PLA 200 generates a pre-defined set of values on output signal lines 245 based on the values of input signal lines 205. This pre-defined set of values is programmed into PLA 200. PLA 200 is programmed by breaking connections between transistor terminals and signal lines within both logical AND plane 220 and logical OR plane 240. These connections can be broken in any of a wide variety of conventional manners. Connections between the transistor terminals and signal lines can be made using fusible links which can be blown in a conventional manner during post-fabrication programming. Alternatively, connections can be broken during the fabrication process by severing previously placed connections, or alternatively the connections between the transistors and the output signal lines may not be made at all during the fabrication process. In another alternate embodiment, rather than cutting connections, transistors whose connections are to be broken are not included in the chip during the fabrication process. The programming of a PLA is well-known to those skilled in the art and thus will not be discussed further.

The operation of PLA 200 is as follows. The input signal lines 205 are provided to logical AND plane 220. Logical AND plane 220 logically ANDs together various input signal lines 205 in accordance with the programming that has been performed. Logical AND plane 220 outputs an intermediary set of signal lines 250 which are the result of the logical ANDing performed by logical AND plane 220. The intermediary signal lines 250 are then each logically AND'd together with a clock signal line 255 by logical AND device 260.

The phases of clock signal line 255 lag behind clock signal line 210. This lag allows the output from logical AND plane 220 to become valid on intermediary output lines 250 prior to clock signal line 255 being asserted. Therefore, the lag in clock signal line 255 prevents the logical OR plane 240 from receiving incorrect signals on intermediary output lines 250. In one embodiment, clock signal line 255 transitions to a high state 580 picoseconds after clock signal line 210 transitions high.

In one embodiment, clock signal line 255 is generated internally by PLA 200. The signal for clock line 255 is generated by inserting the appropriate number of buffers between clock line 210 and clock line 255 to achieve the necessary lag time (e.g., 580 picoseconds). In one implementation, the signal on clock line 210 is inverted prior to being input on clock line 255, as shown. In an alternate embodiment of the present invention, the signal on clock line 255 can be generated by logic external to PLA 200, such as by the same logic which provides clock line 210 to PLA 200.

The intermediary signal lines 250, which are active only when clock signal line 255 is asserted (due to logical AND devices 260), are then input to logical OR plane 240. Logical OR plane 240 logically ORs together various intermediary signal lines 250 in accordance with the programming that has been performed. Logical OR plane 240 then outputs the output signal lines 245, thereby generating the pre-defined outputs.

Thus, the present invention provides a reduced number of gates through which signals propagate for the output of the PLA. Signals input to PLA 200 propagate through four levels of gates prior to having an output generated. These four levels are: one level in logical AND plane 220, two levels for logical AND devices 260, and one level in logical OR plane 240. Therefore, a reduced number of gates are used through which signals propagate in PLA 200, thereby reducing the clock signal to valid output time.

In typical use, the timing of signals input to a PLA include an additional margin for variances in the actual timing of different PLAs. This margin is due to each PLA, when manufactured, being slightly different. These differences are minor and can be caused by slight variances in processing times, temperatures, impurities in the manufacturing materials, etc. Thus, for each level of gates which signals pass through, an additional margin for variances is typically generated to allow the PLAs to operate correctly despite these minor variances. Therefore, the present invention reduces the additional margin for variances which typically must be accounted for by reducing the number of gates used in the PLA architecture.

Figure 3:
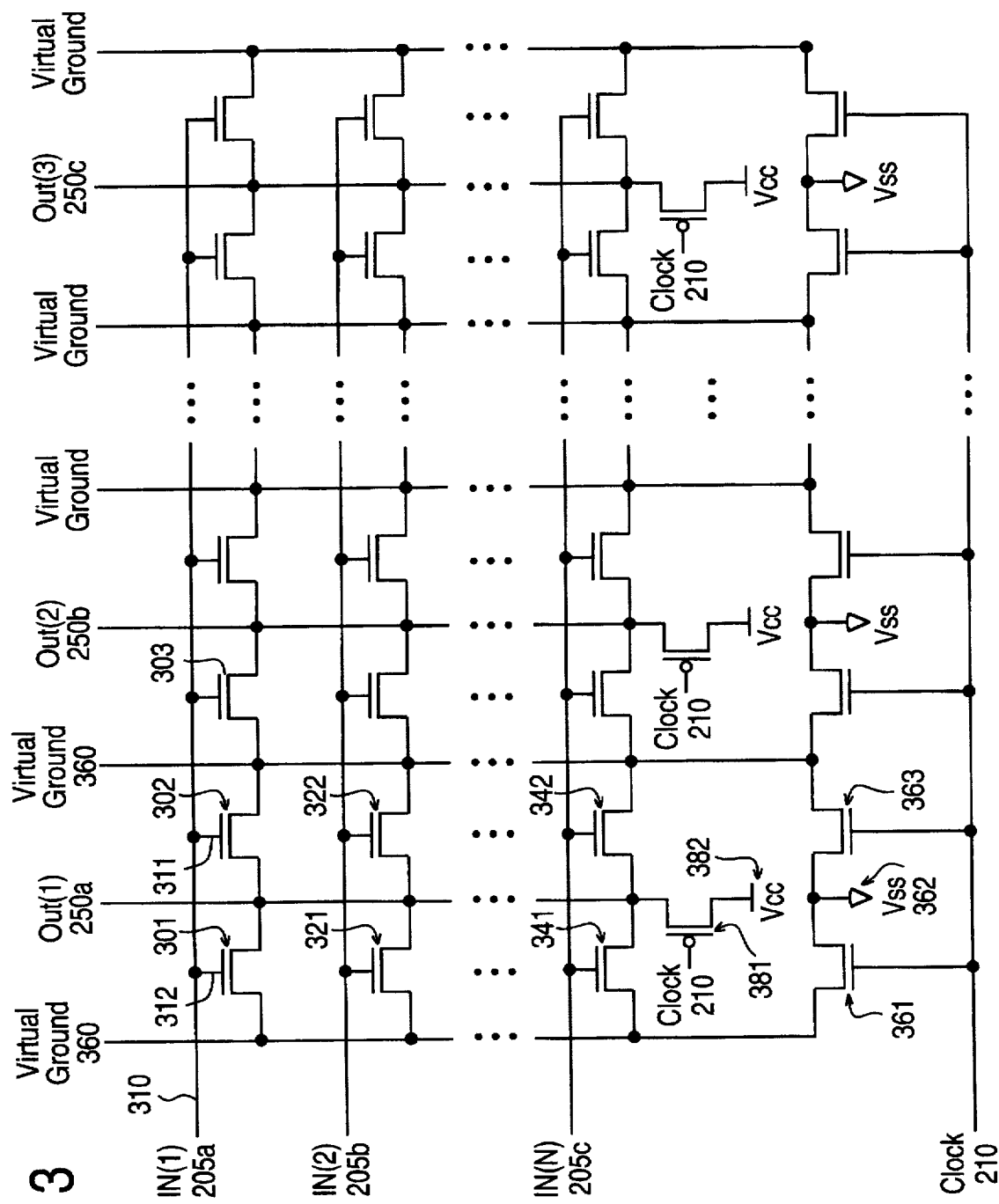
FIG. 3 shows the architecture for a logical AND plane of a PLA according to one embodiment of the present invention.

FIG. 3 shows the architecture for a logical AND plane of a PLA according to one embodiment of the present invention. As shown in FIG. 3, logical AND plane 220 is Type I domino (also referred to as dynamic) logic. Type I domino logic refers to pre-charging the lines to a first state and allowing them to float at that first state until being discharged. An additional transistor in series prevents the lines from being prematurely discharged. In the Type I domino logic shown in FIG. 3, the output line(s) are pre-charged to a first state and are allowed to float at that first state until an input clock signal causes selected output lines (based on which connections were cut) to discharge to a second state. The transistors used in logical AND plane 220 are well known to those skilled in the art but are combined uniquely to produce the results described hereinafter.

FIG. 3 shows N input signal lines 205a, 205b and 205c as inputs to logical AND plane 220. Each of the input signal lines 205a, 205b and 205c are coupled to the gate terminal of an n-channel transistor as shown. Logical AND plane 220 can be programmed by breaking the connection of an input signal line 205 at any of various points. By way of example, input signal line 205a could be cut at location 310, or, alternatively, at location 311. Thus, the connection of all transistors to an input signal line can be cut, or individual connections can be selectively cut. It is to be appreciated that the connection to any one or more of the transistors in logical AND plane 220 can be cut.

In one embodiment of the present invention, the input signals on input lines 205 are required to be set up prior to clock signal line 210 being asserted. This requirement allows each of the intermediary output lines 250 to be pre-charged to a first state and then quickly discharged when the clock signal line 210 is asserted. Thus, the clock input to output signal timing of logical AND plane 220 is reduced.

Each of the transistors 301, 302, 321, 322, 341 and 342 is coupled to a virtual ground line 360 as shown. The lines 360 are referred to as "virtual ground" rather than ground because they are not always connected to ground 362. Whether virtual ground lines 360 provide a connection to ground 362 is dependent on transistors 361 and 363. It is to be appreciated that each of the transistors in the columns of logical AND plane 220 shown in FIG. 3 is coupled in an analogous manner to a virtual ground line.

When clock line 210 is in a low state, n-channel transistor 361 is turned off. Thus, there is no connection between ground 362 and output line 250a, regardless of whether the transistors 301, 302, 321, 322, 341, or 342 are turned off or on. Additionally, when clock line 210 is in a low state, p-channel transistor 381 is turned on. Thus, a connection between voltage source 382 and output line 250a is made, thereby pre-charging output line 250a to a high state.

Prior to the clock signal on clock line 210 transitioning to a high state, the input signal lines 205a–c are asserted. The assertion of the input signal lines 205a–c causes the transistors whose connections to the input signals lines 205a–c are not cut to be turned on. The input signal lines 205a–c need to remain asserted until the signal on clock line 210 transitions high, thereby turning on transistors 361 and 363 and providing a connection between output line 250a and ground 362.

Thus, when the input clock line 210 is in a low state, then the intermediary output lines 250 are pre-charged to a high state. Additionally, the input signals are asserted, thereby preparing the appropriate output lines 250 to be discharged when the clock line 210 transitions high. Then, when the input clock line 210 does transition high, the transistors which have been turned on quickly discharge the output lines 250, thereby causing the appropriate intermediary output lines 250 to transition to a low state.

The Type I domino logic shown in FIG. 3 allows the output lines 250 to be pre-charged to the first state without fear of an erroneous signal on input signal lines 205 causing the premature discharge of any of the output lines 250. Thus, timing constraints for the signals on input signal lines 205 are reduced.

Logical AND plane 220 can be programmed to logically AND together any combination of input lines 205 by cutting the proper connections between input lines 205 and transistors. For example, if the intermediary output line 250a is to be the logical AND of input lines 205a and 205b, then the connections between input lines 205a and 205b and transistors 301, 302, 321, and 322 are not cut. However, the connections between input lines 205c and transistors 341 and 342 are cut. Thus, if the signals on input lines 205a and 205b are both high, then the transistors 301, 302, 321 and 322 will turn on, causing intermediary output line 250a to transition low. This low value on output line 250a can then be inverted to provide the logical AND result. Note that in this example the value of input signal line 205c does not effect the value of the intermediary output line 250a.

For each input signal line 205, two different transistors corresponding to the input signal line 205 are coupled to each of the intermediary output lines 250. For example, transistors 301 and 302 both have a gate terminal coupled to input signal line 205a (although this connection is subject to being cut, as discussed above). Additionally, transistors 301 and 302 also have a terminal coupled to transistor 381 and ground 362.

In one embodiment of the present invention, the transistors which are coupled to an intermediary output line 250a are arranged in columns, as shown in FIG. 3. In this arrangement pairs of transistors, one from each of two adjacent columns, share virtual ground lines 360 as shown. For example, the transistors 302 and 303 each share a common virtual ground line 360. This sharing of virtual ground lines 360 reduces the chip area required for the PLA.

As shown in FIG. 3, a dual-transistor configuration is used to discharge the output lines 250 when necessary. For example, two transistors, transistors 301 and 302, are coupled to intermediary output line 250a. If the programming indicates that output line 250a should be in a low state when input signal line 205a is in a high state, then the connections to both transistors 301 and 302 will not be cut; otherwise, the connections will be cut (e.g., at locations 311 and 312). The dual-transistor configuration increases the speed of logical AND plane 220. This speed increase is due to two series transistors working simultaneously to discharge output line 250a, rather than a single series transistor configuration.

In an alternate embodiment of the present invention, a single series transistor configuration is used. By way of example, transistors 301, 321 and 341 would not be included in logical AND plane 220, only transistors 302, 322 and 342 would be used in this alternate embodiment to discharge intermediary output line 250($a$).

Figure 4:
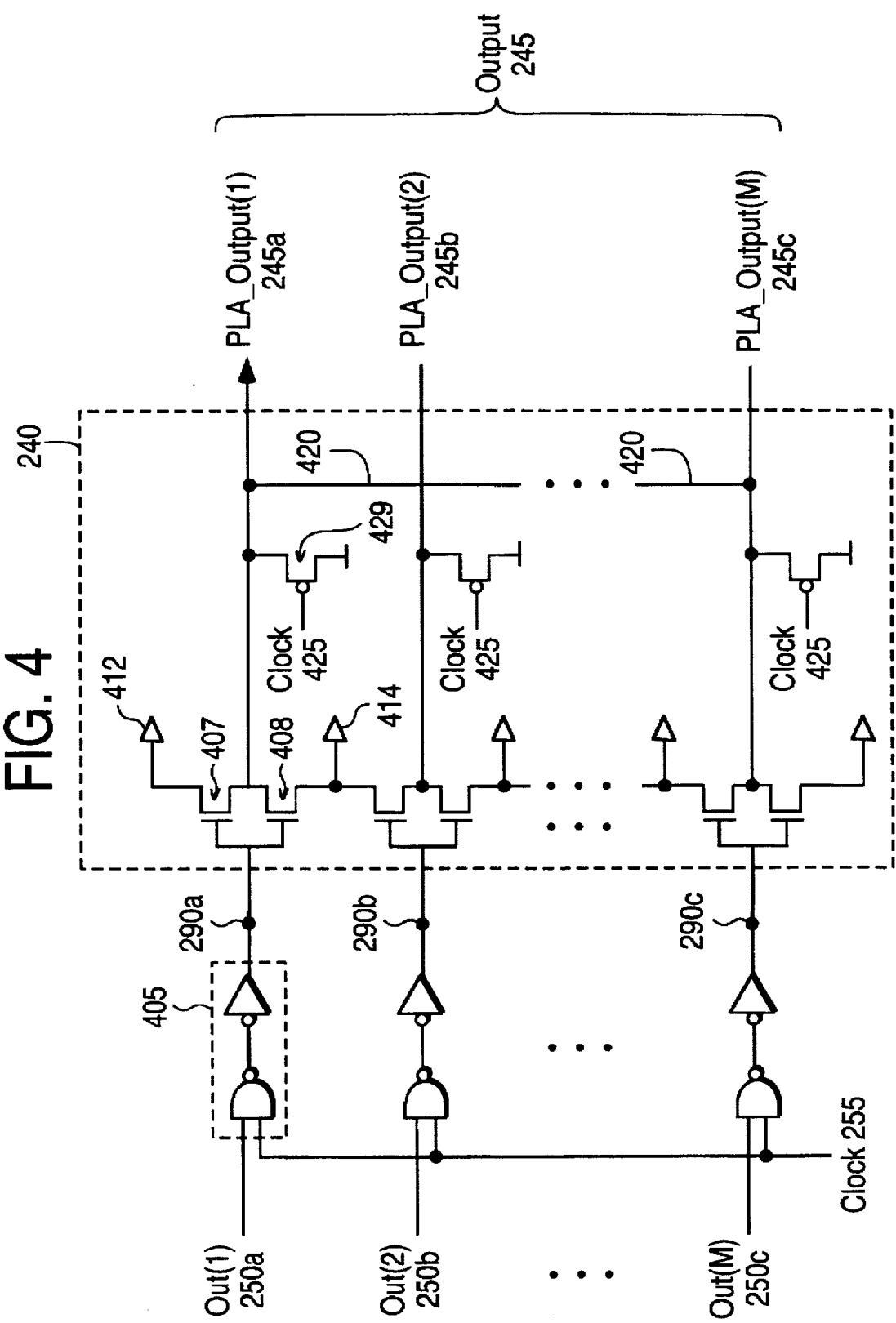
FIG. 4 shows the architecture for a logical OR plane of a PLA according to one embodiment of the present invention.

FIG. 4 shows the architecture for a logical OR plane of a PLA according to one embodiment of the present invention. As shown in FIG. 4, logical OR plane 240 is Type II domino (also referred to as dynamic) logic. Type II domino logic refers to one or more transistors in parallel with a clocked transistor. Output line(s) are pre-charged to a first state and allowed to float at that first state, however there is no clocked transistor in series on the lines to prevent them from being pre-maturely discharged to a second state.

Intermediary output lines 250 are input to logical AND devices 405. Logical AND devices 405 also receive as input clock line 255. Thus, the signals on intermediary output lines 250 are logically AND'd together with a clock signal.

Each of the output lines 245 is connected to a p-channel transistor 429 as shown. The gate terminal of each p-channel transistor 429 is coupled to a clock signal line 425. In one embodiment of the present invention, the clock signal on clock line 425 is an inverted signal of the clock signal on clock line 255. When clock signal line 425 is low, output lines 245 pre-charge to a high state. The output lines 245 are then ready to be quickly discharged when the n-channel transistors turn on.

The output from logical AND devices 405 is input to logical OR plane 240. The output from each logical AND device 405 is coupled to the gate terminal of a transistor. For example, the output from logical AND device 405 is coupled to the gate terminals of n-channel transistors 407 and 408 as shown. When the output from logical AND device 405 is high, then transistors 407 and 408 turn on, causing a connection between output 245a, ground 412, and ground 414. Thus, when the intermediary output 250a transitions high and clock line 255 is high, then the PLA output 245a is high.

The output lines 245 are then connected together via multiple connection lines 420 as shown. The connection lines 420 can be cut in the same manner as connections in logical AND plane 220 can be cut as discussed above. In an alternate embodiment, signals input to logical OR plane 240 can be cut in the same manner as connections in logical AND plane 220 can be cut as discussed above. Connections for signals input to logical OR plane 240 can be cut at, for example, nodes 290a, 290b, and 290c, as shown. Cutting either connections at output lines 245 or nodes 290a–290c allows the appropriate values to be programmed for output from logical OR plane 240.

It is to be appreciated that care should be taken to ensure that the correct signals are on intermediary output lines 250 prior to asserting the signal on clock line 255 in order to ensure that the appropriate signals are input to logical OR plane 240.

It should be noted that the present invention reduces the amount of delay which must be incurred between asserting the input signal lines 205 and asserting the clock line 255. This reduced delay is due to the reduced amount of logic through which signals on lines 205 propagate prior to being input to logical AND plane 220.

The present invention makes use of time-borrowing in the previous clocking phase to set up the input signals early. Typically, signals for a particular clocking phase are not asserted or deasserted until the clock signal for the phase transitions high. Time-borrowing refers to having particular signals asserted or deasserted at the end of the previous clocking phase (when the clock signal is still low), rather than waiting to assert or deassert the appropriate signals until the start of the clocking phase. By taking advantage of time-borrowing, the PLA of the present invention is able improve the clock input to output signal time.

Figure 5:
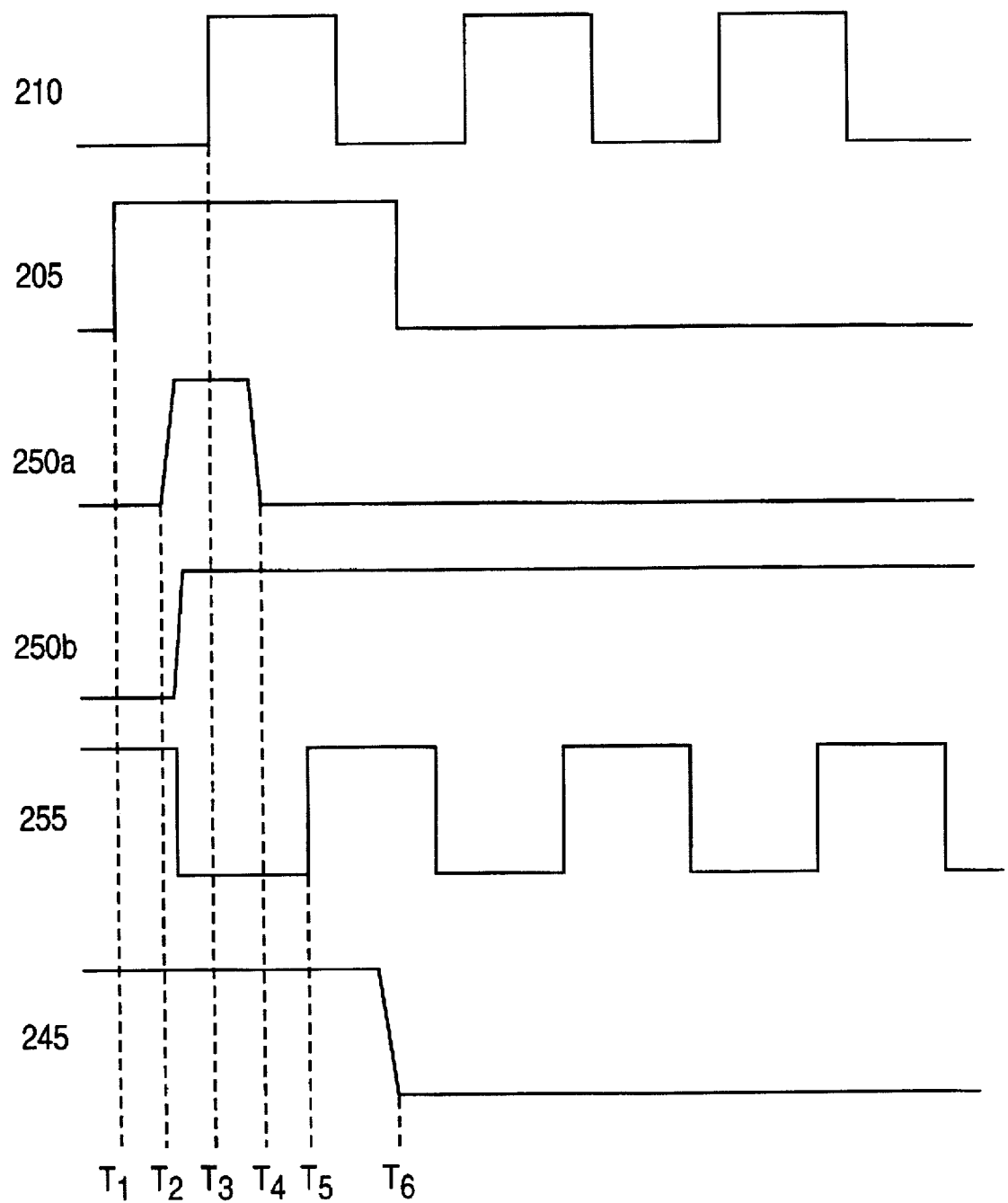
FIG. 5 is a timing diagram showing an example timing of a PLA according to one embodiment of the present invention.

FIG. 5 is a timing diagram showing example timing of a PLA according to one embodiment of the present invention. FIG. 5 shows the values on clock signal line 210, input line 205, intermediary outputs 250a and 250b, clock signal line 255, and output line 245. The values on the input signal lines 205 are first asserted at $t_1$, prior to the rising edge of clock signal 210. This causes intermediary output lines 250a and 250b to pre-charge to a high state as shown at $t_2$. When the clock signal on line 210 transitions high at $t_3$, intermediary output line 250a discharges at $t_4$, whereas intermediary output line 250b remains at the pre-charged high state at $t_4$. It is to be appreciated that which intermediary output lines remain at the pre-charged state and which are discharged is dependent on which connections are cut, as discussed above. The clock signal on clock line 255 then transitions high in $t_5$, providing the inputs to logical OR plane 240. Valid output signals are then produced on output lines 245 at $t_6$.

Figure 6:
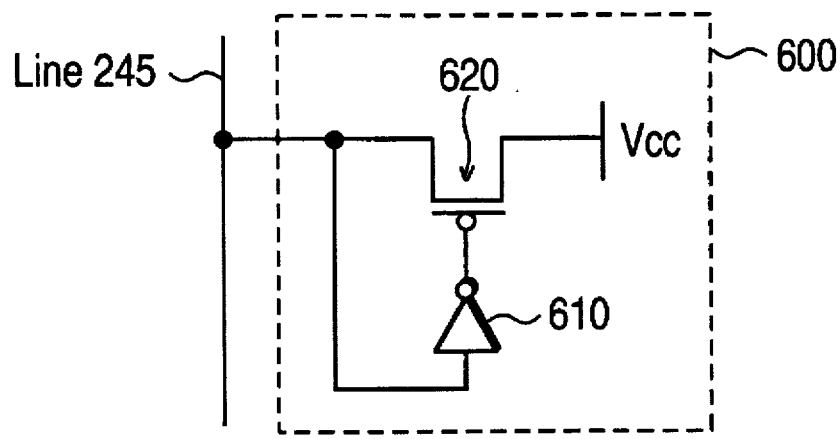
FIG. 6 shows an example retainer which can be used with a PLA according to one embodiment of the present invention.

It is to be appreciated that a wide variety of additional modifications can be made to the PLA 200 of FIG. 2 within the spirit and scope of the present invention. For example, an additional inverter 610 and transistor 620 can be coupled to the outputs of each of the signal lines 245 as shown in FIG. 6. This additional circuitry 600 is referred to as a "retainer" or a "jamb latch", and allows the output to maintain its state if, for example, the clock signal were to be temporarily suspended. The clock signal could be suspended temporarily for a wide variety of reasons, such as a microprocessor using clock throttling to reduce power consumption.

Figure 7:
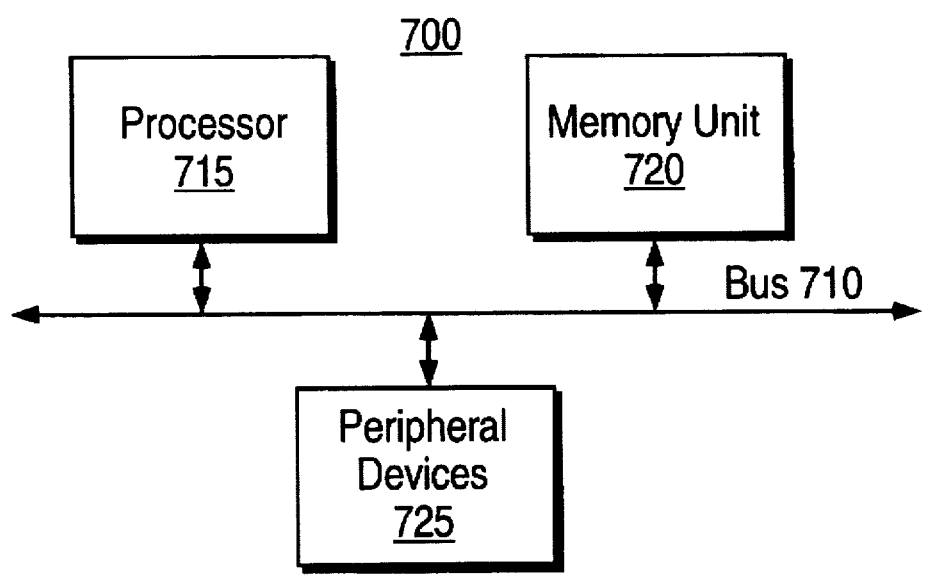
FIG. 7 shows a block diagram of a computer system such as may be used with one embodiment of the present invention.

FIG. 7 shows a block diagram of a computer system such as may be used with one embodiment of the present invention. A computer system 700 is shown comprising a bus or other communication device 710 for communicating information and a processor 715 for processing information and instructions. In one implementation, the processor 715 is an Intel® Architecture microprocessor, available from Intel Corporation of Santa Clara, Calif. However, the computer system 700 may utilize any type of microprocessor architecture; it is to be appreciated that the particular microprocessor architecture used is not especially germane to the present invention.

In one embodiment, bus 710 includes arbitration, address, data and control buses (not shown). The system also includes a memory unit 720 which may be a random access memory (RAM) and/or a read only memory (ROM) for storing information and instructions for the processor 715. Peripheral devices 725 are also coupled to bus 710 for inputting and outputting data and control information to and from the processor 715 and memory unit 720. Peripheral devices could include, for example, a mass storage device such as a magnetic or optical disk and disk drive, a display device, an alphanumeric input device including alphanumeric and function keys, and a cursor control device. A hard copy device such as a plotter or printer may also be included in peripheral devices 725.

It is to be appreciated that computer system 700 may include additional processors or other components. Furthermore, certain implementations may not require nor include all of the above components. For example, an alphanumeric input device or a cursor control device may not be included in peripheral devices 725.

The PLA of the present invention can be used in many of the components of computer system 700. For example, a PLA in accordance with the present invention can be used within processor 715 in decoding instructions received from memory unit 720. By way of another example, PLAs in accordance with the present invention can be used in any one or more of the peripheral devices 725.

It is also to be appreciated that although the discussions above describe the implementation of the present invention using CMOS technology, the present invention can be implemented in any of a wide variety of conventional processing technologies. These processing technologies include, for example, NMOS, BINMOS, etc.

Whereas many alterations and modifications of the present invention will be comprehended by a person skilled in the art after having read the foregoing description, it is to be understood that the particular embodiments shown and described by way of illustration are in no way intended to be considered limiting. References to details of particular embodiments are not intended to limit the scope of the claims.

Thus, a PLA architecture having improved clock signal to output timing using a Type-I Domino AND plane has been described.

What is claimed is:

1. A programmable logic array comprising:
   a logical AND plane including a first plurality of semiconductor devices interconnected such that one terminal of each of the first plurality of semiconductor devices is coupled to one of a first plurality of pre-charge transistors and one terminal of each of the first plurality of semiconductor devices is coupled to one of a plurality of virtual grounds;
   a logical OR plane including a second plurality of semiconductor devices interconnected such that one terminal of each of the second plurality of semiconductor devices is coupled to one of a second plurality of pre-charge transistors and one terminal of each of the second plurality of semiconductor devices is coupled to ground;
   a plurality of inputs to the logical AND plane;
   a plurality of outputs from the logical OR plane;
   a plurality of intermediary outputs coupling together the logical AND plane and the logical OR plane, wherein the first plurality of pre-charge transistors is operative to pre-charge the plurality of intermediary outputs;
   wherein the first plurality of semiconductor devices and the plurality of virtual grounds are operative to discharge a subset of the plurality of intermediary outputs responsive to a first phase of a first clock signal;
   wherein the second plurality of pre-charge transistors is operative to pre-charge the plurality of outputs;
   wherein the second plurality of semiconductor devices is operative to discharge a subset of the plurality of outputs based on both the plurality of intermediary outputs and a first phase of a second clock signal, wherein the first phase of the second clock signal lags behind the first phase of the first clock signal; and
   wherein the second plurality of semiconductor devices are coupled to receive the plurality of intermediary outputs based on the first phase of the second clock signal.

2. The programmable logic array of claim 1, wherein the first plurality of semiconductor devices includes:
   a first transistor; and
   a second transistor.

3. The programmable logic array of claim 2, wherein both the first transistor and the second transistor are NMOS transistors.

4. The programmable logic array of claim 2, wherein:
   the first transistor includes a gate terminal coupled to one of the plurality of inputs, a first terminal coupled to one of the plurality of intermediary outputs, and a second terminal coupled to the second transistor; and
   the second transistor includes a gate terminal coupled to the first clock signal, a first terminal coupled to a ground, and a second terminal coupled to the second terminal of the first transistor.

5. The programmable logic array of claim 1, further comprising one or more clock buffers coupled to receive the first clock signal as an input and coupled to provide the second clock signal as an output.

6. A programmable logic device comprising:
   a first plurality of transistors arranged in transistor pairs;
   a plurality of input lines, wherein each input line of the plurality of input lines is coupled to a gate terminal of one or more of the first plurality of transistors;
   a plurality of intermediary output lines coupled to a second terminal of each transistor of the first plurality of transistors;
   a second plurality of transistors, wherein each transistor of the second plurality of transistors includes a first terminal which is coupled to one of the plurality of intermediary output lines;
   wherein each transistor of the second plurality of transistors also includes a second terminal which is coupled to a ground; and
   wherein each transistor of a transistor pair of the first plurality of transistors includes a terminal coupled to a corresponding intermediary output line of the plurality of intermediary output lines, and wherein the transistors in at least one transistor pair operate together to discharge the corresponding intermediary output line.

7. The programmable logic device of claim 6, further comprising:
   a clock signal line coupled to a gate terminal of each transistor of the second plurality of transistors.

8. The programmable logic device of claim 7, further comprising:
   a third plurality of transistors, wherein the clock signal line is also coupled to a gate terminal of each transistor of the third plurality of transistors.

9. The programmable logic device of claim 8, wherein each transistor of the third plurality of transistors is a PMOS transistor.

10. The programmable logic device of claim 6, wherein each transistor of the first plurality of transistors and each transistor of the second plurality of transistors is a NMOS transistor.

11. A programmable logic array comprising:

a logical AND plane having a first plurality of transistors interconnected using a Type I dynamic logic configuration such that one terminal of each of the first plurality of transistors is coupled to one of a first plurality of pre-charge transistors and one terminal of each of the first plurality of transistors is coupled to one of a plurality of virtual grounds;

a logical OR plane having a second plurality of transistors interconnected using a Type II dynamic logic configuration such that one terminal of each of the second plurality of transistors is coupled to one of a second plurality of pre-charge transistors and one terminal of each of the second plurality of transistors is coupled to ground;

a plurality of inputs to the logical AND plane;

a plurality of outputs from the logical OR plane;

a plurality of intermediary outputs coupling together the logical AND plane and the logical OR plane;

means for pre-charging the plurality of intermediary outputs;

means for discharging a subset of the plurality of intermediary outputs responsive to a first phase of a first clock signal;

means for pre-charging the plurality of outputs;

means for discharging a subset of the plurality of outputs based on both the plurality of intermediary outputs and a first phase of a second clock signal, wherein the first phase of the second clock signal lags behind the first phase of the first clock signal; and wherein the second plurality of transistors are coupled to receive the plurality of intermediary outputs based on the first phase of the second clock signal.

12. The programmable logic array of claim 11, wherein the means for pre-charging the plurality of intermediary outputs places the plurality of intermediary outputs in a first state prior to the first phase of the first clock signal.

13. The programmable logic array of claim 11, wherein the means for pre-charging the plurality of intermediary outputs pre-charges the plurality of intermediary outputs to a high state.

14. The programmable logic array of claim 11, wherein the means for pre-charging the plurality of intermediary outputs includes:

means for providing one of the plurality of inputs to a gate terminal of a first transistor of the first plurality of transistors; and means for providing the first clock signal to a gate terminal of a second transistor of the first plurality of transistors, wherein a first terminal of the second transistor is coupled to a first terminal of the first transistor.

15. The programmable logic array of claim 14, wherein the means for discharging the subset of the plurality of intermediary outputs includes means for providing the first clock signal to a gate terminal of a third transistor of the first plurality of transistors.

16. A method in a programmable logic array having a plurality of inputs, a logical AND plane having a first plurality of transistors interconnected such that one terminal of each of the first plurality of transistors is coupled to one of a first plurality of pre-charge transistors and one terminal of each of the first plurality of transistors is coupled to one of a plurality of virtual grounds, a logical OR plane having a second plurality of transistors interconnected such that one terminal of each of the second plurality of transistors is coupled to one of a second plurality of a pre-charge transistors and one terminal of each of the second plurality of transistors is coupled to ground, and a plurality of intermediary outputs coupling together the logical AND plane and the logical OR plane, the method comprising the steps of:

(a) pre-charging the plurality of intermediary outputs;

(b) discharging a subset of the plurality of intermediary outputs in response to a first phase of a clock signal;

(c) pre-charging a plurality of outputs from the logical OR plane; and (d) discharging a subset of the plurality of outputs based on both the plurality of intermediary outputs and a first phase of a second clock signal, wherein the first phase of the second clock signal lags behind the first phase of the first clock signal, and wherein the second plurality of transistors are coupled to receive the plurality of intermediary outputs based on the first phase of the second clock signal.

17. The method of claim 16, wherein the pre-charging step (a) comprises placing the plurality of intermediary outputs in a first state prior to the first phase of the first clock signal.

18. The method of claim 16, wherein the pre-charging step (a) comprises pre-charging the plurality of intermediary outputs to a high state.

19. The method of claim 16, wherein the pre-charging step (a) includes the steps of:

providing one of the plurality of inputs to a gate terminal of a first transistor of the first plurality of transistors; and providing the first clock signal to a gate terminal of a second transistor of the first plurality of transistors, wherein a first terminal of the second transistor is coupled to a first terminal of the first transistor.

20. The method of claim 19, wherein the discharging step (b) includes the step of providing the first clock signal to a gate terminal of a third transistor of the first plurality of transistors.

* * * * *